(12) United States Patent
Thuss (10) Patent No.: US 9,306,146 B2
(45) Date of Patent: Apr. 5, 2016

(54) LOW THERMAL CONDUCTIVITY THERMOELECTRIC MATERIALS AND METHOD FOR MAKING THE SAME

(71) Applicant: Richard C. Thuss, Berryville, VA (US)

(72) Inventor: Richard C. Thuss, Berryville, VA (US)

(*) Notice: Subject to any disclaimer, the term of this patent is extended or adjusted under 35 U.S.C. 154(b) by 556 days.

(21) Appl. No.: 14/107,143

(22) Filed: Dec. 16, 2013

(65) Prior Publication Data

US 2016/0049571 A1    Feb. 18, 2016

Related U.S. Application Data

(60) Provisional application No. 61/740,518, filed on Dec. 21, 2012.

(51) Int. Cl.
| | |
|---|---|
| H01L 35/16 | (2006.01) |
| H01L 35/34 | (2006.01) |
| H01L 35/22 | (2006.01) |
| H01L 21/02 | (2006.01) |
| H01L 35/18 | (2006.01) |

(52) U.S. Cl.
CPC .......... *H01L 35/34* (2013.01); *H01L 21/02562* (2013.01); *H01L 35/16* (2013.01); *H01L 35/18* (2013.01); *H01L 35/22* (2013.01)

(58) Field of Classification Search
CPC ................... H01L 21/02109; H01L 21/02296; H01L 21/02365; H01L 35/14
See application file for complete search history.

(56) References Cited

U.S. PATENT DOCUMENTS

2014/0116491 A1* 5/2014 Reifenberg ........... B82B 3/0014
                                                                 136/203

* cited by examiner

*Primary Examiner* — Cheung Lee
(74) *Attorney, Agent, or Firm* — Lytle Patent Services (57) ABSTRACT

A method of manufacturing fiber based and syntactic foam based composite type thermally insulating materials that retain high performance thermoelectric properties, and which can be used as thermoelectric generators or Peltier coolers for a wide range of industrial, commercial, residential and military applications.

20 Claims, 10 Drawing Sheets

LOW THERMAL CONDUCTIVITY THERMOELECTRIC MATERIALS AND METHOD FOR MAKING THE SAME

CROSS REFERENCE TO RELATED APPLICATION

This present application claims the benefit of the earlier filing date of U.S. Provisional patent application, Ser. No. 61/740,518 filed 21 Dec. 2012, the entire contents of which being incorporated by reference herein in its entirety.

BACKGROUND

1. Field of the Disclosure

This disclosure relates to a method for fabricating low density, composite thermoelectric materials whose internal micro-structure creates insulation materials with energy generating properties by producing a significant reduction in the net thermal conductivity through the composite type thermoelectric material without a corresponding but opposite effect on the electrical properties, and a unique method for using silicone resins and metal bearing compounds for in-situ formation of thermoelectric materials within these composite thermoelectric material structures.

2. Description of the Related Art

The "background" description provided herein is for the purpose of generally presenting the context of the disclosure. Work of the presently named inventor, to the extent it is described in the background section, as well as aspects of the description which may not otherwise qualify as prior art at the time of filing, are neither expressly nor impliedly admitted as prior art against the present invention.

Thermoelectric materials can be used for both power generation or cooling. A parameter called the Figure of Merit is usually used to define the performance of a thermoelectric material, and the Figure of Merit is a function of the Seebeck coefficient, which is a measure of the magnitude of the induced thermoelectric voltage in response to a temperature difference across that material, and the electrical conductivity and the thermal conductivity. A high Seebeck coefficient and a high electrical conductivity improve the Figure of Merit, while a high thermal conductivity decreases its value. Currently available thermoelectric materials for both Thermoelectric generators and Thermoelectric cooling use high density solid blocks of the thermoelectric materials in their construction and therefore the thermal conductivity of the solid material is difficult to reduce. Considerable work has been done on many different thermoelectric materials trying to minimize the thermal conductivity value of the high density solid material including replacing a small percentage of the atoms within the material with alternatives, using embedded nano structures and layers, and aligning the crystal orientation.

Almost 60% of the energy from the gasoline used by an automobile is lost and goes out the tailpipe as heat. If even a few percent of this "wasted heat" or thermal energy could be converted into electrical energy, then the economic benefit would be huge, reducing fuel consumption, total greenhouse gas emissions per mile driven, and in the case of the military, actually saving soldiers' lives, where many injuries and deaths occur while protecting fuel convoys. Large quantities of waste heat are available from all transportation sources, consumer goods, and industrial processes. As recognized by the present inventor, waste heat that could potentially be reused comes from fossil fuels, the burning of wood and vegetation, and even excess solar energy with examples being the high temperatures in a household attic to the large amount of unused thermal energy generated in concentrated solar collectors.

The best thermoelectric materials made today are made from high density solid, semiconductor type materials with examples being bismuth telluride, lead telluride, clathrates, Skutterudites, silicon-germanium, silicides, and tetrahedrites, and even the best materials have a relatively low efficiency in the conversion of heat into electrical energy. They can convert only a small percent of the waste thermal energy to electrical energy, and some of the best materials also use rare earth elements, which are easily subject to export limits, price manipulations and scarcity. Fabrication processes for even small high performance modules are expensive and the manufacture of thermoelectric materials that can cover large areas from a few square feet to hundreds of square feet is cost prohibitive Most commercially available thermoelectric materials made today for power generation or cooling are semiconductor based materials, which are produced as solid to near solid blocks from pressed or by sintered powder or crystallization, and because they are high density solids, the thermal conductivity through the material is relatively high. A highly limiting factor in the efficiency and performance of a thermoelectric material is the thermal conductivity through the material, and there is extensive work being done to reduce the thermal conductivity in essentially solid materials using replacement atoms within a polycrystalline structure, and the incorporation of nanolayers and nano-materials into the thermoelectric elements.

Figure 1:
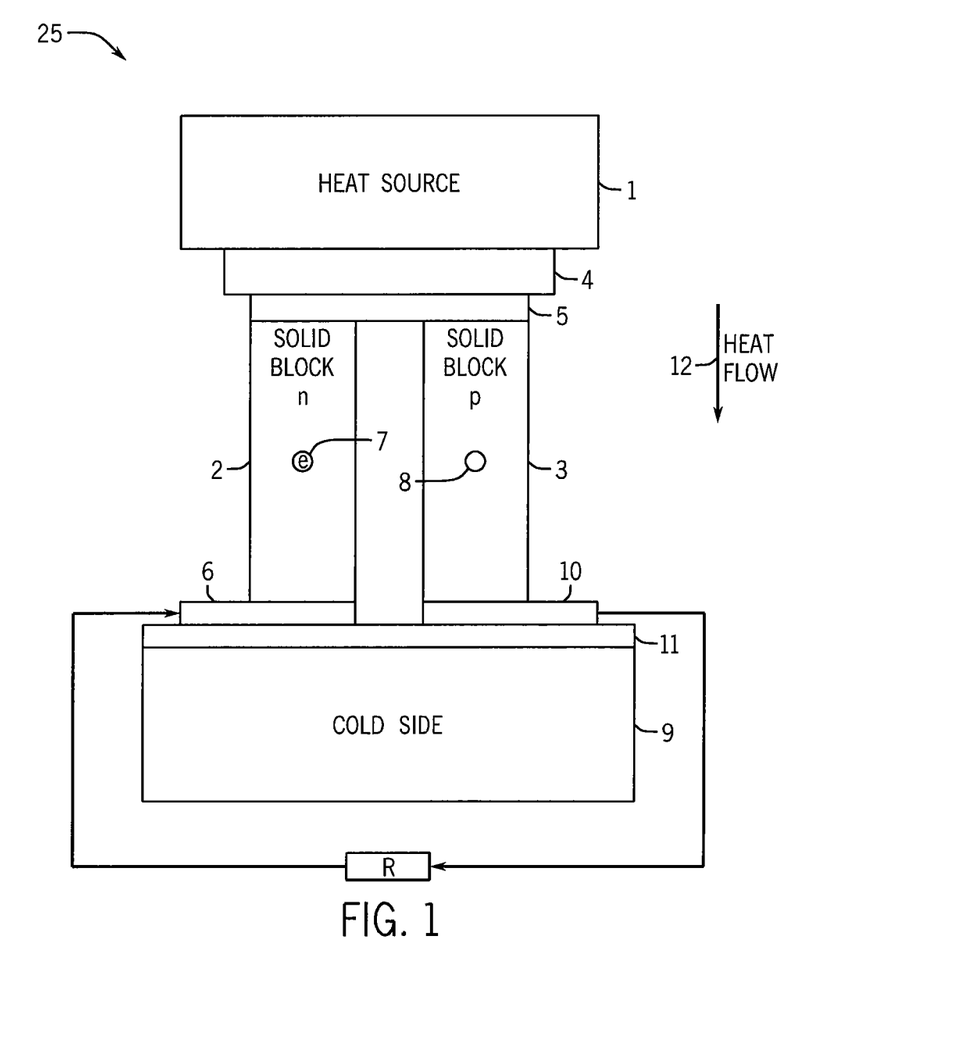
FIG. 1 is an illustrative view of a conventional thermoelectric generator/cooler showing the interconnection of the high-density solid p-type elements and solid n-type elements to form the thermocouple.

FIG. 1 is an illustrative view of a typical conventional, thermoelectric couple 25 being used as a thermoelectric generator with a heat source 1, a high density, solid n-type element 2, a high density, solid p-type element 3, a substrate of non-electrically conducting material 4 at the hot side, and an electrically conducting strip 5 connecting the high density, solid n-type element 2 and the high density, solid p-type element 3 together on the hot side of the system.

On the opposing, or cold side 9, of the high density, solid n-type element 2, an electrically conducting strip 6 is attached. A separate electrically conducting strip 10 is attached to the high density, solid p-type element 3. The conducting strip 6 and the conducting strip 10 are isolated from the cold side 9 or heat sink material and each other by the use of a non-electrically conducting substrate material 11 on the cold side 9.

The temperature difference from the heat source 1 to the cold side 9 causes heat to flow through the system in the direction 12 shown from the heat source 1 to the cold side 9.

The high density, solid n-type elements 2 are commonly composed of materials, which are modified or doped to create an excess of free electrons 7. The high density, solid p-type elements 3 are commonly composed of materials, which are modified or doped to create excess holes 8. These semiconductor elements are commonly composed of high density, near solid Bismuth Telluride, Lead Telluride, Iron Silicide, or Silicon-Germanium or other materials. The excess electrons 7 and excess holes 8 operate as charge carriers and energy carriers. Ceramic layers or plates of the substrate of non-electrically conducting material 4 and non-electrically conducting substrate material 11 are commonly used as substrates to strengthen/support the thermoelectric structure and to provide electrical insulation for the high density, solid n-type element 2 and high density, solid p-type element 3, semiconductor elements from the outer hot side and cold side materials.

The temperature difference from the heat source 1 to the cold side 9 causes the excess of free electrons 7 and excess holes 8 to migrate from the heat source 1 to the cold side 9, and when the conducting strip—6 and the conducting strip 10 at the cold are electrically connected together through an external load, a current will flow in the direction of 12. The high density, solid n-type element 2 and the high density, solid p-type element 3 thermoelectric semiconductors are often connected electrically in series and thermally in parallel to make a thermoelectric generator.

Electrically connecting two materials of different compositions such as the high density, solid p-type element 3 and the high density, solid n-type elements 2 as shown in FIG. 1 can provide a current flow at a voltage and generate electricity when a temperature gradient across the material is maintained. This is known as the Seebeck Effect, which is the conversion of temperature difference directly into electricity. These same elements can be used in reverse as a Peltier cooler where electricity running through the material causes the material to become hot on one side and cold on the other.

Most commercially available p-type and n-type elements for thermoelectric generators and Peltier coolers are fabricated by the mixing of fine milled powders comprising exact mixtures of the fundamental elements of the desired thermoelectric material. These mixtures are then heated at the appropriate temperatures, and processed using various crystal growth and/or sintering techniques needed to form the desired solid to near solid thermoelectric material structure. Through the thickness thermal conductivity can be moderately lowered by complex layering and doping, but the thermal conductivity is still relatively high and the density of the final processed thermoelectric element is high, generally in the range from four grams per cubic centimeter (4 g/cm$^3$) to eight grams per cubic centimeter (8 g/cm$^3$).

SUMMARY

This application describes a novel technique to fabricate what are composite materials, which are low-density insulation materials with thermoelectric properties. Composite structure thermoelectric materials with a significantly lowered density, non solid structure which significantly reduces the thermal conductivity of the composite thermoelectric elements and therefore improve the Thermoelectric Generator or Cooler's performance. The resulting materials are good thermal insulators that also have the properties of thermoelectric generators or Peltier coolers, and they can be used for any application where an insulation material that can also generate electricity has benefit.

Composite type, low-density, low thermal conductivity thermoelectric materials can be fabricated with a controlled, thermal-inhibiting microstructure formed by the use of a combination of micron sized glass, silica, and other ceramic fibers and a combination of glass or silica and/or other hollow or porous ceramic microspheres. The fiber, the microsphere structures, or a combination of the fiber and microsphere structures, when coated or when intermixed with existing and known thermoelectric materials of either the p-type and n-type electrical types form insulation materials that retain thermoelectric properties and that have a significantly reduced thermal conductivity as a result of the composite structure formed. The result is an increase in the low-density, non-solid, or matted, n-type and low-density, non-solid p-type thermoelectric materials' net thermoelectric performance compared to solid or near solid materials, and thermal insulating materials that can also generate electricity. This disclosure describes methods for the formation of controlled structure, composite, insulating materials which can also generate electricity or act as Peltier coolers, and which have a wide range of applications from the extraction of energy from the waste heat from our automobiles and industrial processes, to household attic and wall insulation that generates electrical energy.

DETAILED DESCRIPTION OF THE EMBODIMENTS

Figure 2:
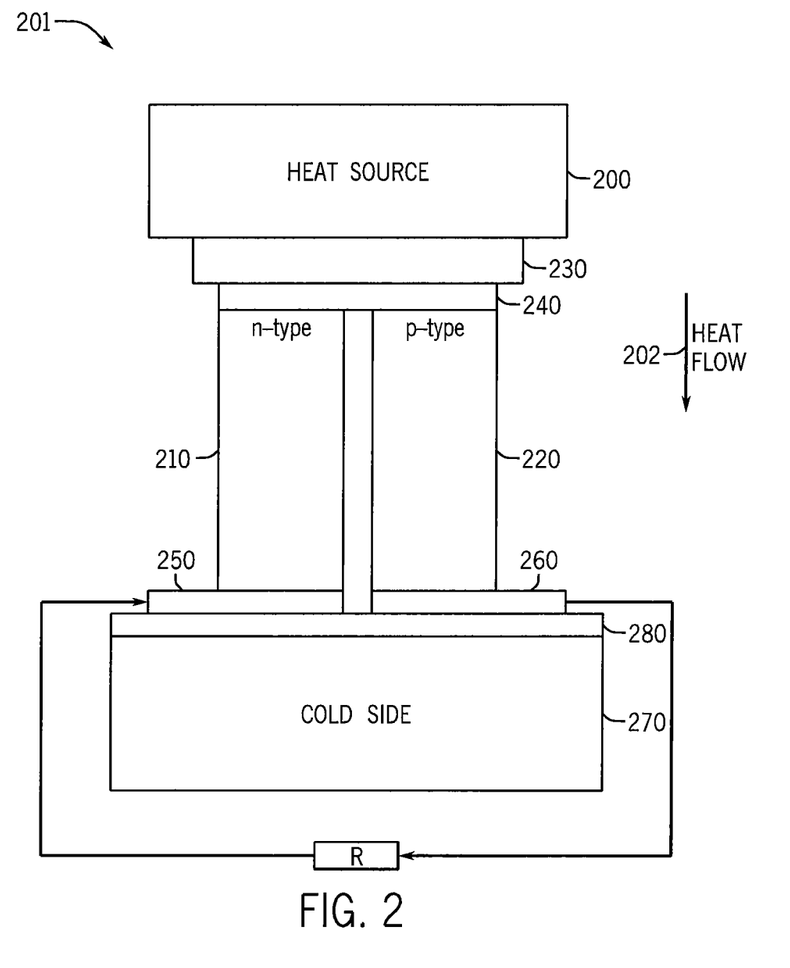
FIG. 2 is an illustrative view of a thermoelectric generator/cooler showing p-type elements and n-type elements, which have been fabricated as composite materials with significantly lowered density and net lower thermal conductivity by the use of matted micron sized fiber and/or hollow or porous microsphere backbone structures, according to one embodiment. The larger cross sectional area and element height are indicative of the ability to make large area thermoelectric generators using this process

FIG. 2 is an illustrative view of a thermoelectric generator 201 according to the present embodiment, in which the individual p-type elements 220 and n-type elements 210 have been fabricated as low density, composite insulator versions of the known current art thermoelectric materials. These lowered density elements are fiber matted and/or syntactic foam-like structures constructed using glass, silica, or other ceramic fibers and/or hollow thin-walled, or porous microspheres in a predetermined mixture with the thermoelectric material to produce a controlled micro structured composite, thermally insulating material with significantly lowered thermal conductivity compared to high density, solid or near solid thermoelectric materials.

These p-type elements 220 elements and the n-type elements 210 because of their lowered density matted and/or foam like composite structures and therefore advantageous thermal and mechanical properties can be fabricated respectively in greater thickness and in significantly larger areas with a net benefit to recover energy from waste heat sources over large and complex shaped areas relative to conventional thermoelectric materials. The fiber and or microsphere backbone structure of the elements help maintain a large delta temperature through the thickness of the elements and reduce the need for active cooling on the cold side of the resulting thermoelectric device.

As shown, a heat source 200, a non-electrically conducting material 230, and an electrically conducting strip 240, which connects the n-type elements 210 and the p-type elements 220 together at the heat source 200 side of the system. The n-type elements 210 and the p-type elements 220 are controlled porosity composite thermoelectric materials made with a backbone, thermally insulating, non-electrically conducting structure. The n-type elements 210 and the p-type elements 220 as composites can be used to form larger area, complex shaped, low thermal conductivity n-type elements 210, and p-type elements 220 are coupled with the electrically conducting strip 240 electrically connecting both the n-type elements 210 to the p-type elements 220 respectively.

On an opposing side of the thermoelectric generator, a non-electrically conducting layer 280 is attached to the cold side 270 of the system. An electrically conducting strip 250 is attached to the n-type elements 210 and an electrically conducting strip 260 is attached to the p-type elements 220. The electrically conducting strip 250 and the electrically conducting strip 260 are electrically isolated from each other by the non-electrically conducting layer 280. The temperature difference from the heat source 200 to the cold side 270 causes heat to flow through the system in the direction 202 shown from the heat source 200 to the cold side 270.

When the electrically conducting strip 250 is connected through a resistance (a current path) to the electrically conducting strip 260, a current flows.

Figure 3:
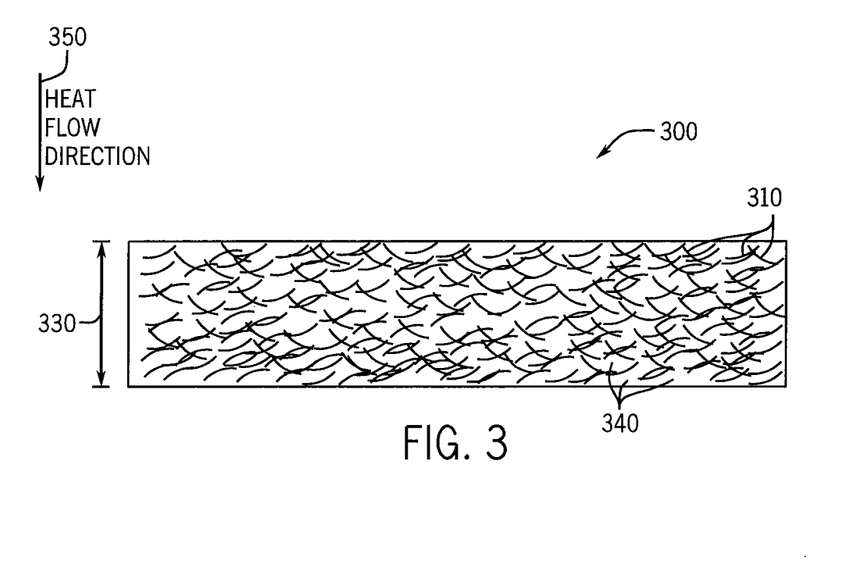
FIG. 3 is an illustrative view of a fiber mat fabricated from micron sized, semi-random silica, glass or other low conductivity ceramic fibers used to create a very low-density structural backbone for a composite type thermoelectric material

FIG. 3 illustrates a high temperature, semi-random silica fiber mat 300 backbone for a composite structure made using sub-micron to low micron sized diameter fibers. The semi-random silica fiber mat 300 creates a low-density, very low thermal conductivity, electrically insulating backbone for the fabrication of composite thermoelectric materials. The composite thermoelectric material structures made using the semi-random silica fiber mat 300 type backbone have significantly lowered thermal conductivity through the thickness of the material due to fiber size, fiber orientation, fiber lengths, mat density, and composition.

This type of mat used as a backbone structure for the thermoelectric material results in a significant reduction in the net thermal conductivity through the final felted, composite thermoelectric material 330 without a corresponding and fully opposing effect on the electrical properties. The semi-random silica fiber mat 300 has short length fibers 310 with fiber diameters varying over the range of 0.2 micron to 5 micrometers, having a predominant orientation perpendicular to the heat flow 350.

The thermoelectric material 340 will coat the individual matted fibers and fiber intersections and/or fill a percentage of the regions between the fibers. The coating thickness an/or percentage of the space between the fibers that is filled at the time of fabrication is determined based on the density of the fiber mat, the desired composite thermal conductivity, and the amount of thermoelectric material needed to provide a continuous electrical path through the material thickness and to obtain the required thermoelectric performance, as well as the mechanical properties necessary to fabricate the material into a thermoelectric composite for its intended end application. Volume fractions of the thermoelectric material within the composite structure from several percent with a fiber coating only, up to ninety percent with a particle filler are possible yielding materials with a wide range of insulation and thermoelectric properties for a diverse set of applications.

The semi-random silica fiber mat 300 used for the backbone structure can be made using a standard felting process, and the fiber composition is selected based on the thermoelectric material used and the final processing temperatures. For example, microfibers made of borosilicate glass are a good match when using bismuth telluride particles as the filler material. The semi-random silica fiber mat 300 can be made from borosilicate glass, silica, or other high temperature ceramic materials and for low processing and use temperatures organic fibers can be used. A wide range of thermoelectric materials can then be used to either coat the fibers or fill a specific percentage of the open regions between the fibers, prior to, during, or after the mat felting process. For low temperature applications, organic fibers and organic thermoelectric materials can be used to create felted mat type composites that generate electrical energy.

Figure 4:
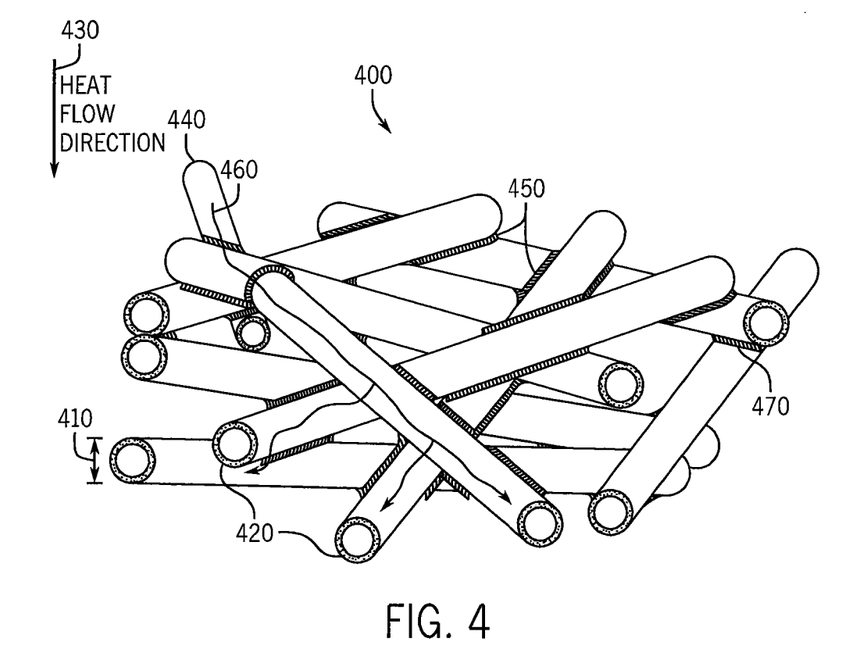
FIG. 4 is an illustrative view of a resulting insulation and thermoelectric material composite structure after the fibers and fiber intersections have been coated with a thermoelectric material.

FIG. 4 is a magnified illustration of an embodiment of a composite thermoelectric material 400 formed by an n-type low density or a p-type low density, semi-random matted fiber backbone structure made from fibers 410 in the 0.2 through 5 micron diameter range, which have been coated with a thermoelectric material 420, such as but not limited to Bismuth Telluride, Lead Telluride and any thermoelectric material vapor deposited or otherwise uniformly deposited on the surface of the micron sized fibers. These fibers are short and by virtue of the felting and matting process they are semi-randomly oriented so that most of the fibers remain nearly perpendicular to the direction of heat flow 430 with only a few percent of the fibers oriented near parallel 440 to the direction of heat flow 430 through the material 400. The n-type or p-type thermoelectric material coats the fibers along their length and filets 450 in the areas where individual fibers contact. The thin, sub micron to micron thick layer fiber coating 420 and the fillets 450 of the thermoelectric material provide the electrical path 460 through the composite thermoelectric material 400 in the general direction of the heat flow 430. The thin n-type or p-type material coating, plus the fillets 450 at the intersections create a long, circuitous thermal and electrical path 460 through the thermoelectric material and the total composite which reduces the phonon transport through the thermoelectric material without a significant detrimental effect on the Seebeck coefficient or the electrical conductivity.

Both the n-type and p-type elements of a thermoelectric generator use the same construction technique and methods, but the coating and fillet materials are doped with different materials to produce either an n-type or p-type thermoelectric material. The low density, semi-random matted fiber backbone structure can be made by first coating the fibers 410 with thermoelectric material 420 prior to felting the fibers into a mat with semi-random fiber orientation and then heat treating the composite matted structure to a temperature that sinters the coated fibers together at their contact points to form the electrical contact fillets 450 at the fiber intersections, or by first forming the fiber mat and subsequently coating the fibers 410 with thermoelectric material 420 both on the fiber surfaces and the fiber intersections 450. As can be seen, the semi-random orientation of the overlaid fibers forms a matrix of fibers having a low concentration density. This low density is observed by spaces formed due to the various fibers being overlaid in layers upon one another by the felting process and only contacting at the fiber intersection points.

An alternate process using a methyl-phenyl silicone resin precursor can be used to form silica fiber-to silica fiber fillets of pure silica at the contact points prior to thermoelectric material coating when borosilicate glass, silica or other ceramic material fibers are used to form the low density, semi-random matted fiber backbone structure. This alternate process forms a surface at the intersections 470 for thermoelectric material deposition and also fully rigidizes the fiber backbone prior to thermoelectric material deposition.

By using semi-random fiber matted felt 300 in which all the fibers 410 and their intersections are coated with a thermoelectric material 420, creating fillets 450, the resulting thermoelectric material is low density insulation and therefore has very low thermal conductivity compared to solid thermoelectric block elements.

The electrical properties of the thermoelectric material 420 and the fillets 450 are essentially maintained when using this type of composite matted construction, but the total thermal conductivity through the thickness of the composite is significantly reduced when compared to a solid material, and therefore significant improvement can potentially be realized in the conversion efficiency from waste heat directly into electrical energy.

Depending on the composition of the fiber 410 used for the matted felted backbone and the processing methods, composite materials can be constructed, over a density range from 0.10-4.0 grams/cc.

In some applications, a methyl-phenyl silicone resin may be used to initially bind the felted and matted fibers together, and then the resin is decomposed to form a substantially pure silica layer that creates fillets 470 at the fiber intersections. These fillets 470 can aid in the creation of a continuous thermoelectric material coating of the fibrous backbone throughout the material when using chemical vapor deposition, wet chemistry methods, or other thermoelectric material deposition methods.

Figure 5:
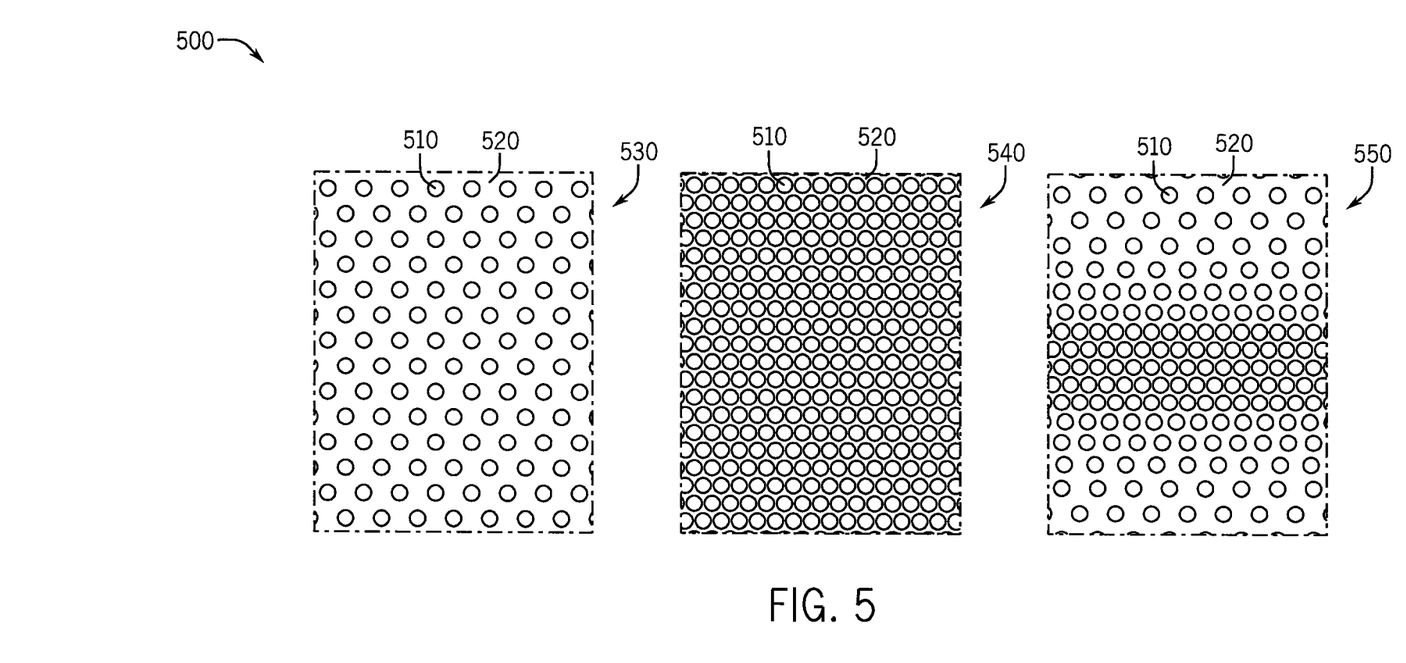
FIG. 5 is a drawing of a composite insulating type thermoelectric material depicting a range of glass, silica or other ceramic hollow or porous microsphere filler content forming low density and lower thermal conductivity composite thermoelectric materials.

FIG. 5 is a magnified illustration of three different examples of a low density composite matrix thermoelectric material structure 500 with medium to high and/or varying volume fractions of micrometer sized porous or hollow microspheres 510 mixed with a thermoelectric material 520. The micrometer sized porous or hollow micro spheres 510 are made from non electrically conductive glass, silica, or other ceramic materials being used to create a syntactic foam-like structure to lower the density and thermal conductivity of a bulk thermoelectric material solid creating a composite, insulating foam-type material that retains the fundamental electrical characteristics of the thermoelectric material. As shown a low to moderate microsphere filler content mix 530, a medium to high microsphere filler content mix 540, and a varied through the thickness microsphere filler content mix 550 of microspheres 510 and particles in the range from 1-40 microns of a known semiconductor type thermoelectric material 550 such as bismuth telluride, lead telluride, skutterudites, tetrahedrites, silicides, silicon-germanium, which partially to completely fills the remaining volume between the microspheres 510. The hollow, thin walled, or highly porous microspheres 510 act as thermal boundaries significantly reducing the net thermal conductivity of the processed composite materials compared to the bulk, or solid thermoelectric materials. Processing of the mixtures in a controlled atmosphere and elevated temperature conditions results in the sintering and binding of the thermoelectric material 520 particles into a continuous electrical path through the thickness of the composite material. High temperature sintering also thermally and mechanically connects the thermoelectric material and the microsphere filler. The ratio of thermoelectric material 520 to microspheres 510 determines the density of the final composite, syntactic foam insulating material; therefore a wide range of thermal and thermoelectric properties can be realized. The low to moderate microsphere filler content mix 530 using porous or hollow glass, silica or other ceramic microspheres yielding a composite with volume fraction of the thermoelectric material of 90%-75%. The medium to high microsphere filler content mix 540 yielding a volume fraction of the solid thermoelectric material of 75-25%. The varied through the thickness microsphere filler content mix 550 yielding a varying thermal and electrical conductivity composite thermoelectric material. Thermocouple n-type elements 210 and p-type elements 220 densities in the range of 1.0 grams per cubic centimeter to almost the full density of the bulk thermoelectric material can be fabricated, according to the present teachings. Composite materials formed from the low to moderate microsphere filler content mix 530, the medium to high microsphere filler content mix 540, and the varied through the thickness microsphere filler content mix 550 can each be fabricated into n-type 210 and p-type 220 elements based on the thermoelectric material powders, which are used during fabrication of the syntactic foam like insulating, thermoelectric material composite.

Figure 6:
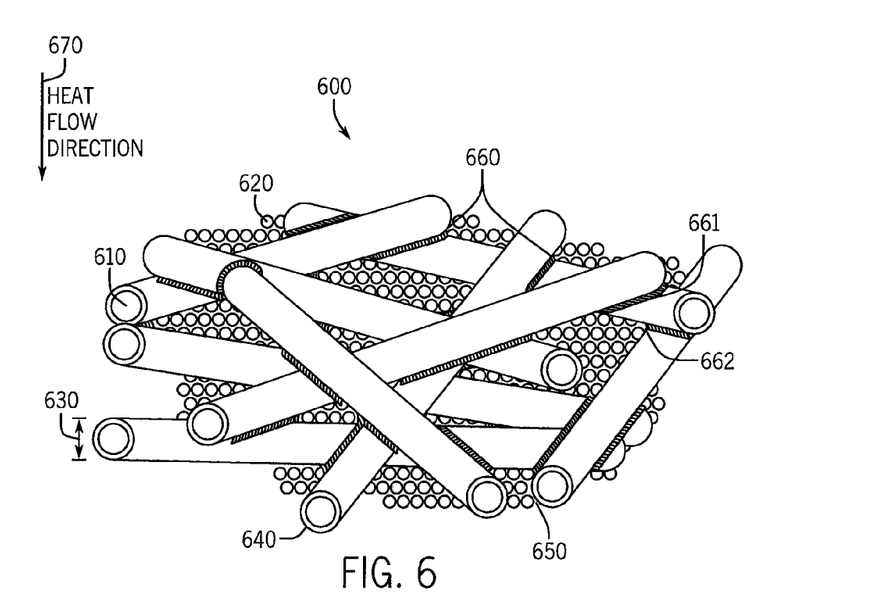
FIG. 6 is an illustrative view of low-density, thermoelectric composite matrix formed from micron sized fibers and hollow or porous microspheres with their surfaces coated with a thermoelectric material.

FIG. 6 is an illustrative view of another embodiment of a thermoelectric material 600 composed of fibers 610 microspheres 620 and a thermoelectric material 640, which coats and/or fills the interstices 650 between the fibers and the microspheres and fillets 660 at the fiber-to-fiber intersections 661, and fiber-to-microsphere 662 intersections. The fibers 610 have a borosilicate glass, slica or other ceramic fiber core 610 with a diameter 630 of 0.2-5 microns. The hollow or porous microspheres 620 are made from borosilicate glass, silica or other ceramic microspheres with diameters, which can vary from less that one to forty microns in diameter. As can be seen the random orientation of overlaid fibers and intermixed microspheres forms a matted matrix of thermoelectric material coated fibers and microspheres having a low density. This low density, thermal insulation type thermoelectric composite material which retains the thermoelectric properties of the thermoelectric material filler is created both by the microspheres and by the spaces formed due to the various fibers and microspheres being overlaid in layers upon one another and only contacting at fiber-to-fiber, fiber to microsphere or microsphere to microsphere intersections and/or the non uniform shape of the thermoelectric. The microspheres are hollow or porous also reducing the final density and thermal conductivity of the final fiber reinforced, syntactic foam composite thermoelectric material in the direction of the heat flow 670. The fibers aid in maintaining the structural integrity of the composite when fabricated and used as large area n-type elements 210 and p-type elements 220.

Figure 7:
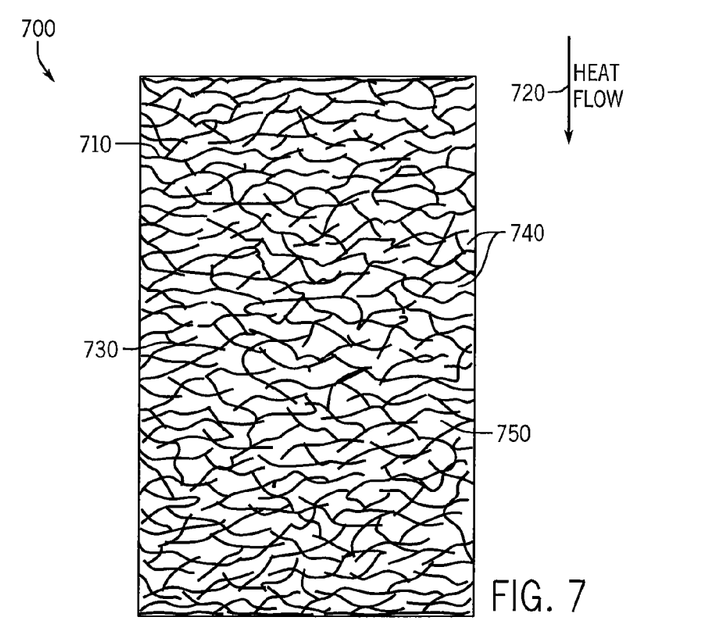
FIG. 7 is a drawing of a preferred embodiment of a resulting insulating fibrous structure thermoelectric material after a coating on the fiber surface and intersections with a thermoelectric material and showing the large number of open, micron sized pores within the composite structure.

FIG. 7 illustrates a magnified view of another embodiment of a p-type or n-type thermoelectric material composite element 700 having thermoelectric material coated matted fiber backbone resulting in a low density thermal insulation with thermoelectric properties providing a net improvement in the thermoelectric material figure of merit. The final element is a rigid, non-solid matted thermoelectric composite material where the thermoelectric material coated fibers 710 are primarily oriented perpendicular to the heat flow 720 through the thermoelectric material. A small percentage (e.g., 1%-10%) of the fibers are oriented more parallel to the heat flow. Fiber coating and fillets of thermoelectric material are formed at the fiber-to-fiber intersections 730 during the thermoelectric coating fabrication process which can include but not limited to chemical vapor deposition or wet chemistry formation processes, which provide a continuous thermal and electrical path through the thickness of the thermoelectric composite material 740. The resulting felted structure is a lowered density, non-solid, (matted) thermoelectric composite material 750 with lowered thermal conductivity and improved net thermoelectric performance compared to conventional solid thermoelectric materials. The fiber felting process forms a lowered density non-solid, micro porous structure 700.

Figure 8:
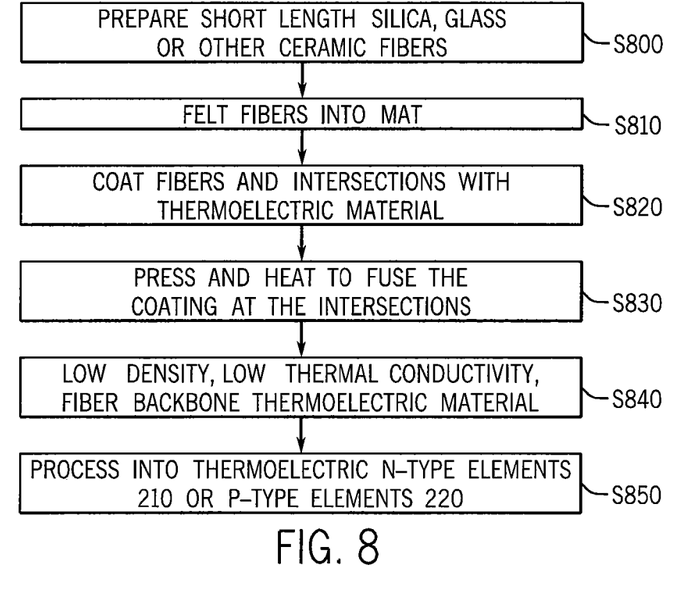
FIG. 8 shows a block diagram an embodiment of a method of constructing composite type low density, low thermal conductivity thermoelectric materials for both the P and N type thermoelectric elements using felted silica, glass, or other ceramic fibers as a backbone structure where the fibers and the fiber to fiber intersections are coated with a nanometer to micrometer thick layer of thermoelectric material.

FIG. 8 describes a process for fabricating low density, low thermal conductivity fiber based composite insulation materials wherein the fiber based composite insulation materials have thermoelectric properties using a felted borosilicate glass, silica or other ceramic fiber backbone as shown if FIG. 7. The fibers and the fiber to fiber intersections are coated with nanometer to micrometer thick layer of thermoelectric material. The process begins in Step 800 where short length glass, silica, or other ceramic fibers are prepared for felting. After Step 800 is completed, the process proceeds to Step 810 where fibers are mixed into denatured alcohol, or other liquid to fully disperse the fibers and these dispersed fibers are wet felted into a thick mat and then dried at temperatures up to 100 degrees centigrade to remove the alcohol. Step 810 results in a predominant orientation of the fibers perpendicular to the material thickness. Step 810 proceeds to Step 820 where these fibers and intersections are coated with a micron thick layer of a thermoelectric material such as one of the tellurides using processes such as chemical vapor deposition and wet chemistry methods. After Step 820 is completed, the process proceeds to Step 830. In Step 830 the thermoelectric material and fiber backbone composite are compressed to a desired density, from 0.1-1.0 gr/cc, and heated under controlled atmosphere conditions to a temperature below the melting point of the fibers and the thermoelectric material to sinter or fuse the thermoelectric material at the fiber-to-fiber intersections. After Step 830 is completed, the process proceeds to Step 840 where the material is cooled and the pressure removed resulting in a composite thermoelectric material with thermal insulating properties having a low density and very low net thermal conductivity compared to a conventional solid block of thermoelectric material with a net improvement in thermoelectric material properties. After Step 840 is completed, the process proceeds to Step 850 where very large area, large thickness, insulation type thermoelectric composite elements of p-type elements 220 and n-type elements 210 can be fabricated by this process and then electrically connected to make insulation blankets that generate electricity.

The electrically conductive and thermal paths through the material are primarily from fibers 410 being coated with the thermoelectric material 420 contacting other fibers 410 having been coated with thermoelectric material 420, and because of the relatively short fiber length and small diameter of the fibers 410, the long and circuitous thermal and electrical path 460 is created through the material. Even at very low densities in the order of a few tenths of a gram per cubic centimeter, the radiation and convective thermal transport through the material is kept to a minimum by the micron sized thermoelectric material 400 and insulating thermoelectric composites of this type can be used at temperatures exceeding 1000 degrees centigrade.

The described fabrication techniques can be used to create very low density, low thermal conductivity thermoelectric composite materials of many types including tellurides, silicides, magnesium based compounds, skutterudites, and even organic thermoelectric materials and by tailoring the raw materials and processes, to achieve different material densities and fiber to thermoelectric material ratio's, a wide range can be achieved in the thermoelectric performance of the insulating composite structure. These low-density insulation thermoelectric materials, which both insulate and generate electricity, have potential applications in many industrial processes, energy generation systems, transportation systems, insulation materials to use for building insulation, and high temperature thermoelectric insulation materials for hypersonic vehicles.

Figure 9:
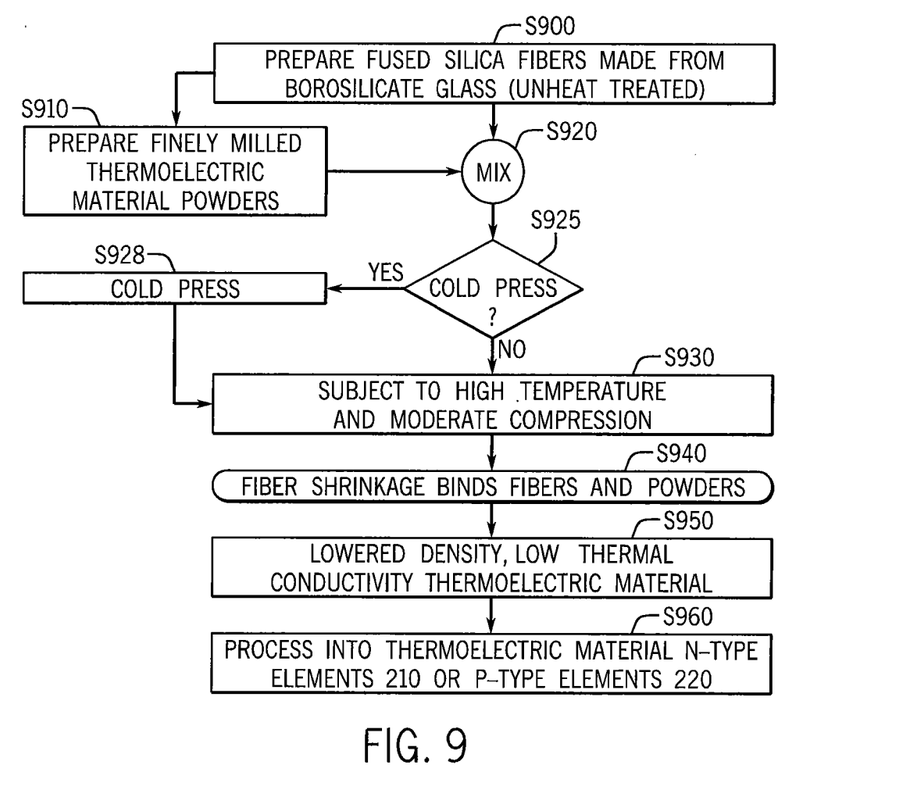
FIG. 9 shows a block diagram of another embodiment of a method of constructing a lowered density, low thermal conductivity composite materials for both the p-type thermoelectric elements and n-type thermoelectric elements where high purity fused silica fibers made from a borosilicate glass are used to create a backbone structure that compresses the thermoelectric material filler when processed.

FIG. 9 describes another process for fabricating lowered density, lowered thermal conductivity thermoelectric composite material using micron sized, nearly pure silica fibers made from a borosilicate glass precursor. The process begins in Step 900 where pure silica fibers made from borosilicate glass, and not yet heat-treated to heal the holes left by the boron removal process, are prepared for mixing. The process proceeds to Step 910 where a powder of finely milled particles in a size range from 1-40 microns of a known thermoelectric material such as bismuth telluride, lead telluride, any of the skutterudites, tetrahedrite, silicides are prepared for mixing. After Step 900 and Step 910 are completed, the process proceeds to Step 920 where the prepared silica fibers of Step 900 are mixed in an denatured alcohol solution with the prepared finely milled particles of Step 910 and wet felted and then dried using a controlled temperature rise to approximately one hundred degrees centigrade to remove the denatured alcohol. After Step 920 is completed, the process proceeds to Step 925 where a decision to cold press the material made in Step 920 should take place. If there is no need to cold press the material made in Step 920, the process proceeds to Step 930 where the resulting thermoelectric particle filled, fiber felt composite of Step 920 is subjected to controlled temperature rise to 550-650 degrees centigrade and held for a period of less than an hour in a non oxidizing environment under zero to moderate compression of several pounds per square inch. If the decision in Step 925 is to Cold Press the material made in Step 920 to the process proceeds to Step 928 where the material made in Step 920 is cold pressed using pressures in the order of 10-20 tons per square inch to create a higher density, higher thermal conductivity composite materials with greater final structural properties. Upon completion of Step 928, the process proceeds to Step 930 where the resulting thermoelectric particle filled, fiber felt composite of Step 928 is subjected to controlled temperature rise to 550-650 degrees centigrade and held for a period of less than an hour in a non oxidizing environment under zero to moderate compression of several pounds per square inch. The result from Step 930 continues to be processed in Step 940 where at the peak temperature and during the high temperature holding period the composite material undergoes shrinkage as the "leached out holes" in the silica fibers anneal and fill in compressing the thermoelectric particles between the fibers and improving the sintering and binding of the thermoelectric material of Step 910 particles together. The process proceeds to Step 950 where the temperature is slowly reduced to room temperature and the shrinkage of the fibers in Step 940 then binds the thermoelectric material particles within the fiber matrix. A lowered density, lower thermal conductivity insulating type thermoelectric material that can be formed in large cross-sectional areas, large thicknesses and in complex shapes can be obtained using this composite fabrication approach. After Step 950 is completed, the process proceeds to Step 960 where the resulting material from Step 950 is processed into thermoelectric material n-type elements 210 or thermoelectric material p-type elements 220 as couple elements.

Figure 10:
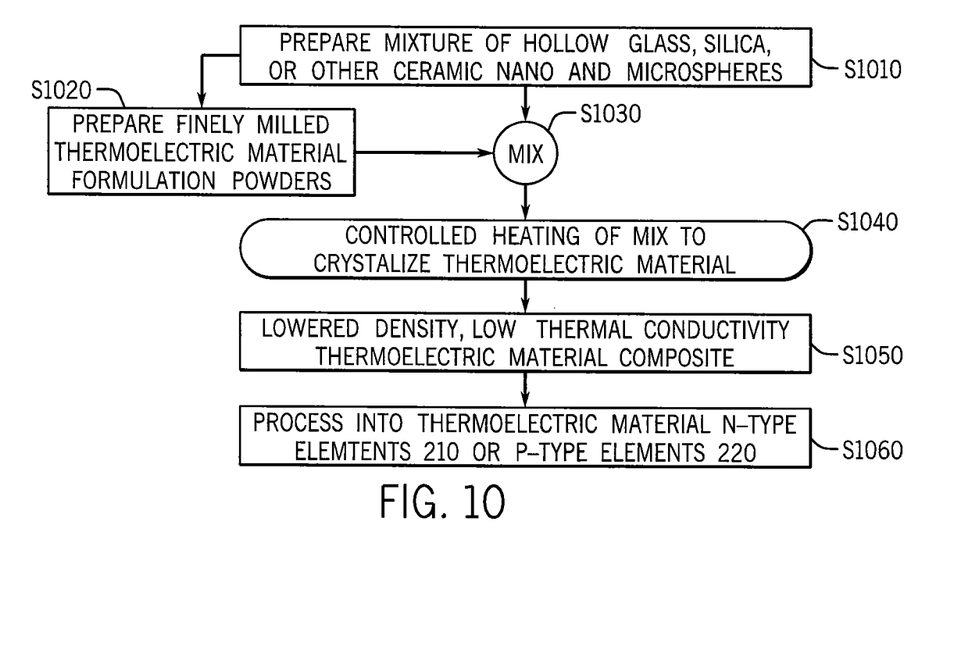
FIG. 10 is a block diagram of another embodiment of a method of constructing a low density, low thermal conductivity composite material, which uses hollow or porous microspheres in combination with a thermoelectric material filler to form a syntactic foam type of insulating composite thermoelectric material.

FIG. 10 describes another process for fabricating thermoelectric material using a hollow microsphere backbone, low density, low thermal conductivity thermoelectric composite insulation type materials with a low to moderate microsphere filler content 530, a medium to high microsphere filler content 540, and a varied through the thickness microsphere filler content 550 of FIG. 5. The process begins in Step 1010 where thin walled, hollow borosilicate glass, silica, or other ceramic microspheres are prepared for mixing. The hollow microspheres have a nominal size range from one to 40 microns in diameter.

The process proceeds to Step 1020 where a finely milled powder in the nominal particle size range from 1-40 microns made from thermoelectric material such as polycrystalline bismuth telluride is formulated and prepared for mixing.

After Step 1010 and Step 1020 are completed, the process proceeds to Step 1030 where the prepared hollow and or porous microspheres of Step 1010 and the prepared finely milled thermoelectric material of Step 1020 are mixed using techniques including, but not limited to a dry mixing process and/or a denatured alcohol liquid based mixing process. Varying volumetric or weight ratios of microspheres 510 to thermoelectric material 520 are used to form the low to moderate microsphere filler content mix 530, the medium to high microsphere filler content mix 540, and the varied through the thickness microsphere filler content mix 550 materials. The disbursement of the hollow, thermally and electrically insulating microspheres within the finely milled thermoelectric material creates a thermoelectric composite material syntactic foam with reduced total density and also reduced bulk conductivity of the final syntactic foam thermoelectric composite material improving the net thermoelectric performance of the final material in Step 1060.

After Step 1030 is completed, the process proceeds to Step 1040 where the resulting mixture of Step 1030 is cast as a paste into a mold or pressed into a pellet and then subjected to a controlled heating cycle initially at temperatures less than 100 degrees C. to remove any residual volatile materials, and then placed in a non-oxidizing atmosphere with the temperature raised slowly and then held for a period less than an hour in order to sinter the thermoelectric material particles into a continuous electrical path. The mixing process of Step 1030, the casting or pellet forming process of 1040, and the controlled heating process of Step 1040, control the distribution of the thin-walled, hollow microspheres. The constant density low to moderate microsphere filler content mix 530, and the constant density medium to high microsphere filler content mix 540, and varied through the thickness microsphere filler content mix 550 syntactic foam insulation, thermoelectric composite materials can be made. The composition and physical boundaries at the thermoelectric material and the thin-walled hollow microsphere interface formed in Step 1040, and the hollow or porous interior of the microspheres act in concert to create a low thermal conductivity composite p-type elements 220 or a composite n-type elements 210 material in Step 1060.

The process proceeds to Step 1050 where the material is cooled in a controlled non oxidizing atmosphere and where the controlled disbursement of hollow microspheres of Step 1030 and the controlled heating of Step 1040 result in a material that yields a low density, low thermal conductivity syntactic foam insulation, thermoelectric composite material. After the completion of the controlled cool down cycle of Step 1050, the process proceeds to Step 1060 where the resulting material from Step 1050 is processed into thermoelectric material n-type elements 210 or thermoelectric p-type elements 220. The fabrication technique and the unique composite syntactic foam-like structure allow large cross sectional area, large thickness, and complex shaped thermoelectric n-type elements 210 and thermoelectric p-type elements 220 to be formed.

Materials can be constructed using just several percent by volume of the microsphere filler all the way up to a high volume filler content greater than fifty percent thus resulting in materials of 1.0 grams per cubic centimeter density to close that of the bulk density of the solid thermoelectric material.

Figure 11:
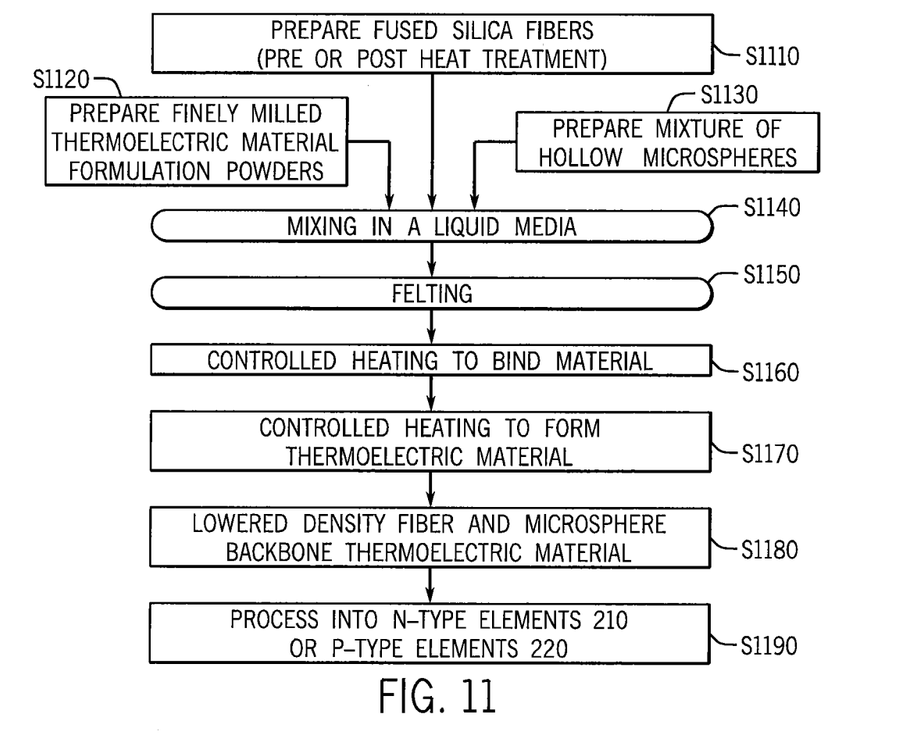
FIG. 11 is a system block diagram of another embodiment of a method of constructing a low density, low thermal conductivity thermoelectric composite material which creates the composite low density backbone structure by the use of both microfibers and microspheres.

FIG. 11 describes another process for fabricating low density, low thermal conductivity thermoelectric composite material shown in FIG. 6. The process begins in Step 1110 where micron sized fused silica fibers made from borosilicate glass are prepared for mixing either pre-heat treatment or post-heat treatment. Step 1120 is performed in conjunction with Step 1110. During Step 1120 finely milled particles in the weight ratio of the individual elements needed to form a known polycrystalline thermoelectric material such as a doped p-type or n-type bismuth telluride are prepared for mixing. Step 1130 is performed in conjunction with Step 1110 and Step 1120. During Step 1130 a mixture of hollow glass, silica, borosilicate glass, or other ceramic hollow microspheres are prepared for mixing. The hollow, thin walled microspheres range in nominal size from 1-40 micron in diameter. After Step 1110, Step 1120, and Step 1130 are completed, the process proceeds to Step 1140 where the prepared fused silica fibers of Step 1110, the particles of the individual elements of Step 1120, and the mixture of hollow microspheres of Step 1130 are mixed using denatured alcohol. The process proceeds to Step 1150 where the mixture is wet felted, and the excess liquid drained. The process proceeds to Step 1160 where the felted composite mat is dried in a non-oxidizing atmosphere while slowly raising the temperature from room temperature to 100 degrees C. to remove the alcohol and then holding it there for 1-24 hours depending on the thickness. Once the denatured alcohol has been removed, the composite mixture of fibers, microspheres and element powders is subjected to a controlled heating profile over several hours in a non-oxidizing atmosphere up to a temperature where the particles of the individual elements within the composite melt, react and combine to form an intermediate, not fully crystallized bismuth telluride thermoelectric material and held there for up to 24 hours before slowly cooling to room temperature. The process proceeds to Step 1170 where the silica fiber reinforced, hollow borosilicate glass microsphere, non-fully crystallized bismuth telluride, composite material of Step 1160 is subjected to a higher heating profile in a non oxidizing atmosphere high enough to melt the thermoelectric material, which is mechanically trapped in the interstices between the fibers and the microspheres, and then the temperature is slowly reduced to allow full crystallization of the thermoelectric material within the composite structure. After Step 1170 is completed, the process proceeds to Step 1180 where the p-type elements 220, or n-type elements 210 low density, fiber reinforced, syntactic foam like composite insulating thermoelectric material is cooled to room temperature. The process proceeds to Step 1190 where the resulting material of Step 1180 is processed into thermoelectric material n-type elements 210 or thermoelectric material p-type elements 220 couple elements. The determination of the material being fabricated into n-type elements 210 or p-type elements 220 is made in the selection of powders used in Step 1120. This felted fiber reinforced syntactic foam composite insulation type structure and the process used allows the formation from the individual elements of large cross sectional area, large thickness and potentially complex shaped, thermoelectric materials with very low thermal conductivity.

Figure 12:
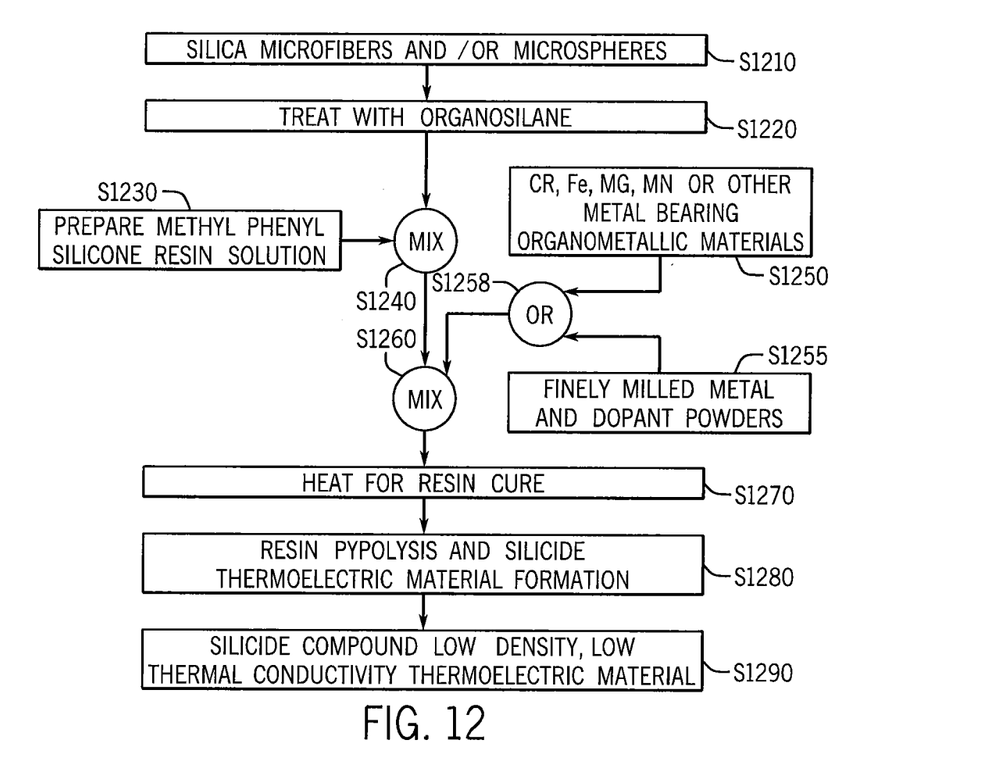
FIG. 12 is a system block diagram of another embodiment of a method for constructing a low density, low thermal conductivity silicide thermoelectric composite material where the backbone structure of the insulating material is coated with a silicide type thermoelectric material by the in-situ reaction between a decomposing methyl-phenyl silicone resin and organometallic or other metal bearing compounds.

FIG. 12 describes another process for fabricating low-density, low thermal conductivity silicide thermoelectric composite material achieving improved performance of silicide type thermoelectric materials. The process begins in Step 1210 where silica microfibers and/or borosilicate glass or pure silica microsphere are prepared. After Step 1210 is completed, the process proceeds to Step 1220 where the microfibers and/or microspheres are treated with a organosilane vapor to react with the water molecules on the surface of the silica fibers or microspheres, producing a reactive silanol species. The process proceeds to Step 1230 where a high residual silica content methyl-phenyl silicone resin is prepared for mixing with the pre-treated microfibers and microspheres of Step 1220. After the completion of Step 1220 and Step 1230 the process proceeds to Step 1240 where the treated microfibers and/or microspheres are then mixed with a high residual silica content methyl-phenyl silicone resin in a denatured alcohol solution to coat the fiber and or microsphere surfaces with the resin aided by the reactive silanol species formed on the fiber and or microsphere surfaces in Step 1220.

Step 1250 is performed independent of Step 1210, Step 1220, Step 1230, and Step 1240. During Step 1250, organometallic materials, which include Chromium, Iron, Magnesium, Cobalt or other atoms, which form silicide thermoelectric materials, when reacted at high temperatures with a silicone resin are prepared. Step 1255 is performed independent of Step 1250. During Step 1255, a finely milled powder with particle size in the range of one micron of Chromium and/or other metals and dopants are mixed together which form silicide thermoelectric materials are first treated with a silane.

After Step 1250 and Step 1255 are performed the process proceeds to Step 1258 where a determination is made whether to combine the resin and alcohol solution, coated microfibers and/or coated microspheres mix of Step 1240 with the organo-metallic materials of Step 1250 or to combine the mix of Step 1240 with the silane coated metal powders of Step 1255. This determination is based upon the particular silicide thermoelectric material desired as the end product.

The process proceeds to Step 1260 where the resin/alcohol solution, coated microfibers and/or microspheres mixture of Step 1240 are mixed with the material selected in Step 1258.

The process proceeds to Step 1270 where the mixture of Step 1260 is first wet felted into a composite mat like structure then dried over a period of 24 hours in a controlled temperature profile from room temperature to 100 degrees centigrade. The dried, mat-like composite structure is then subjected to a heating profile where the temperature is increased approximately 50 degrees centigrade per hour to 250 degrees centigrade and held for one hour to cure the resin then slowly reduced to room temperature. The process proceeds to Step 1280 where the dried and cured composite material is placed in a container to restrict but not prohibit air flow around the material and then subjected to a controlled temperature rise at a nominal rate of 50 degrees centigrade per hour to 550 degrees centigrade and then held at a constant temperature and low oxygen content atmospheric conditions to fully decompose the silicone resin. The chemically active state of the silica intermediary compounds formed during the methyl-phenyl silicone resin pyrolysis reacts with the organometallic or metallic metal powders and dopants, and a silicide thermoelectric material coating is formed on the microsphere or fiber surfaces and at the silicone resin fillets between fibers or between microspheres which were formed from the silicone resin during Step 1270. The material is then cooled to room temperature. The process proceeds to Step 1290 where the active silica surface formed during Step 1280 has reacted with the metal bearing compounds to form a coating of silicide thermoelectric material on the fibers and/or microspheres. This material is a low-density, insulating, silicide thermoelectric composite material.

I claim:

1. A method of manufacturing a low thermal conductivity, low density syntactic foam composite thermoelectric material having a low density, thermally and electrically insulating backbone microstructure formed by the use of micron diameter porous silica microspheres or hollow borosilicate microspheres, the method comprising:
   coating surfaces of microspheres surfaces and contact points between respective microspheres or partially filling interstices between the microspheres with a thermoelectric material; and controlled heating and applying pressure to the microspheres and thermoelectric material to create a low density, low thermal conductivity thermoelectric material composite with both insulator and thermoelectric properties.

2. The method of claim 1 wherein
   the thermally and electrically insulating backbone microstructure comprises between ten and sixty percent by volume of the thermoelectric material after the controlled heating and applying pressure steps.

3. The method of claim 1, wherein
   the thermoelectric material or filler material includes at least one of Bismuth Telluride or Lead Telluride.

4. The method of claim 1, further comprising:
   processing the thermoelectric material composite to form an n-type thermoelectric element.

5. The method of claim 1, further comprising:
   processing the thermoelectric material composite to form a p-type thermoelectric element.

6. The method of claim 1, further comprising:
   processing the thermoelectric material composite so that the backbone thermally and electrically insulating hollow or porous sphere structure varies in volume content through the thermoelectric material thickness in a direction of heat flow.

7. The method of claim 1, further comprising:
processing the thermoelectric material composite by an addition of micron sized glass or ceramic fibers to enhance final structural integrity of the thermoelectric material composite.

8. The method of claim 1 wherein
the thermoelectric material composite has greater cross sectional area and thickness in a direction of heat flow compared to a bulk or a solid type thermoelectric material.

9. A method of manufacturing a low thermal conductivity, low density felted composite thermoelectric material comprising:
forming a low density thermally and electrically insulating backbone microstructure by felting into a semi-random orientation, short length, sub-micron to micron diameter fused silica or borosilicate glass fibers;
coating fiber surfaces and fiber intersections, or partially filling interstices between fibers with micron sized particles of a thermoelectric material; and
processing under controlled heating and pressure conditions to produce a fiber backbone composite thermoelectric material that retains both thermally insulating and thermoelectric properties.

10. The method of claim 9 wherein
the forming includes forming low density, felted fiber backbone structure composite thermoelectric material with a density of less than 1 gram per cubic centimeter.

11. The method of claim 9 further comprising:
processing the fiber backbone composite thermoelectric material to form an n-type thermoelectric element.

12. The method of claim 9 further comprising:
processing the fiber backbone composite thermoelectric material to form a p-type element.

13. The method of claim 9 further comprising:
processing the fiber backbone composite thermoelectric material using residual silica formed by decomposition of a high solids content methyl phenyl silicone resin precursor to form fillets at fiber-to-fiber intersections which rigidize the composite thermoelectric material and allow a continuous surface path for the thermoelectric material through the thermoelectric material in a direction of heat flow.

14. The method of claim 9 wherein
fiber orientation in the fiber backbone structure is substantially perpendicular to heat flow in the composite thermoelectric material and a conductive thermal path through the thermoelectric material is highly extended compared to a bulk or a solid thermoelectric material.

15. The method of claim 9 wherein
the low density thermally and electrically insulating backbone microstructure before coating is partially filled with a fine mesh powder of bismuth telluride and through further high temperature processing forms a lowered density, lowered thermal conductivity thermoelectric material.

16. The method of claim 9 wherein
The low thermal conductivity, low density felted composite thermoelectric material includes a mixture of thermally processed micron sized fibers, hollow microspheres and powder of a predetermined thermoelectric material.

17. The method of claim 9 further comprising:
applying a thermoelectric blanket covering an area greater than 1.0 square meter.

18. A method of in-situ fabricating a silicide type thermoelectric composite material within a low density, low thermal conductivity fiber based, or microsphere based thermally and electrically insulating backbone microstructure comprising:
performing a high temperature reaction of a methyl-phenyl silicone resin compound with sub-micron to micron sized metal particles, or organometallic materials;
coating a backbone structure material with a solution or suspension containing the methyl-phenyl silicone resin compound and a metal bearing compound;
felting and drying the backbone structure material after the coating; and
controlling atmosphere and temperature decomposing the methyl-phenyl silicone resin compound so as to react with the metal bearing compound to form low density, low thermal conductivity silicide type thermoelectric composite material.

19. The method of claim 18, further comprising:
processing the thermoelectric composite material to form an n-type thermoelectric element.

20. The method of claim 18, further comprising:
processing the thermoelectric composite materials to form a p-type thermoelectric element.

* * * * *